(12) United States Patent
Lin et al.

(10) Patent No.: US 9,123,789 B2
(45) Date of Patent: Sep. 1, 2015

(54) CHIP WITH THROUGH SILICON VIA ELECTRODE AND METHOD OF FORMING THE SAME

(71) Applicant: UNITED MICROELECTRONICS CORP., Hsin-Chu (TW)

(72) Inventors: Ming-Tse Lin, Hsinchu (TW); Chu-Fu Lin, Kaohsiung (TW); Chien-Li Kuo, Hsinchu (TW); Yung-Chang Lin, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/747,492

(22) Filed: Jan. 23, 2013

(65) Prior Publication Data
US 2014/0203394 A1  Jul. 24, 2014

(51) Int. Cl.
| | |
|---|---|
| H01L 23/00 | (2006.01) |
| H01L 21/768 | (2006.01) |
| H01L 23/48 | (2006.01) |
| H01L 23/498 | (2006.01) |
| H01L 23/522 | (2006.01) |
| H01L 49/02 | (2006.01) |

(52) U.S. Cl.
CPC ........ H01L 21/76898 (2013.01); H01L 23/481 (2013.01); H01L 23/49827 (2013.01); H01L 23/5226 (2013.01); H01L 24/16 (2013.01); H01L 28/60 (2013.01); H01L 2224/4824 (2013.01); H01L 2225/06513 (2013.01); H01L 2225/06541 (2013.01); H01L 2924/0002 (2013.01)

(58) Field of Classification Search
CPC .................. H01L 23/481; H01L 2225/06513; H01L 2225/06541; H01L 24/16; H01L 23/49827; H01L 2224/4824
See application file for complete search history.

(56) References Cited

U.S. PATENT DOCUMENTS

| | | | | |
|---|---|---|---|---|
| 7,410,884 | B2 * | 8/2008 | Ramanathan et al. | 438/455 |
| 7,968,460 | B2 * | 6/2011 | Kirby et al. | 438/667 |
| 8,039,303 | B2 * | 10/2011 | Shim et al. | 438/107 |
| 8,378,495 | B2 * | 2/2013 | West | 257/774 |
| 8,592,310 | B2 * | 11/2013 | Park et al. | 438/667 |
| 8,592,988 | B2 * | 11/2013 | Lee et al. | 257/773 |
| 8,592,991 | B2 * | 11/2013 | Lee et al. | 257/774 |
| 8,653,648 | B2 * | 2/2014 | Chen et al. | 257/698 |
| 8,659,162 | B2 * | 2/2014 | Suthiwongsunthorn et al. | 257/774 |
| 8,674,513 | B2 * | 3/2014 | Yu et al. | 257/774 |
| 2005/0133930 | A1 * | 6/2005 | Savastisuk et al. | 257/774 |
| 2006/0040423 | A1 * | 2/2006 | Savastibuk et al. | 438/106 |
| 2009/0294983 | A1 * | 12/2009 | Cobbley et al. | 257/774 |
| 2009/0315154 | A1 * | 12/2009 | Kirby et al. | 257/621 |
| 2010/0130003 | A1 * | 5/2010 | Lin et al. | 438/637 |
| 2010/0140752 | A1 * | 6/2010 | Marimuthu et al. | 257/621 |

(Continued)

Primary Examiner — Ngan Ngo
(74) Attorney, Agent, or Firm — Winston Hsu; Scott Margo

(57) ABSTRACT

The present invention provides a method of forming a chip with TSV electrode. A substrate with a first surface and a second surface is provided. A thinning process is performed from a side of the second surface so the second surface becomes a third surface. Next, a penetration via which penetrates through the first surface and the third surface is formed in the substrate. A patterned material layer is formed on the substrate, wherein the patterned material layer has an opening exposes the penetration via. A conductive layer is formed on the third surface thereby simultaneously forming a TSV electrode in the penetration via and a surface conductive layer in the opening.

8 Claims, 5 Drawing Sheets

(56) References Cited

U.S. PATENT DOCUMENTS

| | | | |
|---|---|---|---|
| 2010/0144118 A1* | 6/2010 | Yang et al. | 438/459 |
| 2010/0178747 A1* | 7/2010 | Ellul et al. | 438/386 |
| 2010/0244208 A1* | 9/2010 | Pagaila et al. | 257/659 |
| 2010/0252934 A1* | 10/2010 | Law et al. | 257/774 |
| 2010/0264512 A1* | 10/2010 | Lin et al. | 257/528 |
| 2010/0308443 A1* | 12/2010 | Suthiwongsunthorn et al. | 257/621 |
| 2011/0210452 A1* | 9/2011 | Roozeboom et al. | 257/774 |
| 2011/0241205 A1* | 10/2011 | Kirby et al. | 257/738 |
| 2011/0254165 A1* | 10/2011 | Muranaka | 257/751 |
| 2012/0056330 A1* | 3/2012 | Lee et al. | 257/774 |
| 2012/0056331 A1* | 3/2012 | Park | 257/774 |
| 2012/0074584 A1* | 3/2012 | Lee et al. | 257/774 |
| 2012/0083116 A1* | 4/2012 | Yang et al. | 438/653 |
| 2012/0091520 A1* | 4/2012 | Nakamura | 257/303 |
| 2012/0112361 A1* | 5/2012 | Han et al. | 257/774 |
| 2012/0133048 A1* | 5/2012 | Lee et al. | 257/774 |
| 2012/0142185 A1* | 6/2012 | Park et al. | 438/667 |
| 2012/0153430 A1* | 6/2012 | Bachman et al. | 257/508 |
| 2012/0223426 A9* | 9/2012 | Shim et al. | 257/737 |
| 2012/0256300 A1* | 10/2012 | Nakamura | 257/621 |
| 2012/0299194 A1* | 11/2012 | Lee et al. | 257/774 |
| 2013/0026599 A1* | 1/2013 | Nakamura et al. | 257/508 |
| 2013/0200528 A1* | 8/2013 | Lin et al. | 257/774 |
| 2013/0264707 A1* | 10/2013 | Lee | 257/737 |
| 2013/0264720 A1* | 10/2013 | Chun et al. | 257/774 |
| 2013/0285257 A1* | 10/2013 | Lee et al. | 257/774 |
| 2013/0302979 A1* | 11/2013 | Yu et al. | 438/653 |
| 2013/0313724 A1* | 11/2013 | Joblot et al. | 257/774 |
| 2013/0320506 A1* | 12/2013 | Schmitt et al. | 257/621 |
| 2013/0334669 A1* | 12/2013 | Kuo et al. | 257/621 |
| 2013/0334699 A1* | 12/2013 | Kuo et al. | 257/774 |
| 2014/0057430 A1* | 2/2014 | Lee et al. | 438/613 |
| 2014/0061888 A1* | 3/2014 | Lin et al. | 257/690 |
| 2014/0070404 A1* | 3/2014 | Sheu et al. | 257/737 |
| 2014/0077374 A1* | 3/2014 | Lin et al. | 257/741 |
| 2014/0091473 A1* | 4/2014 | Len et al. | 257/774 |
| 2014/0094007 A1* | 4/2014 | Andry et al. | 438/197 |
| 2014/0097890 A1* | 4/2014 | Li et al. | 327/551 |
| 2014/0103520 A1* | 4/2014 | Kirby et al. | 257/737 |
| 2014/0110861 A1* | 4/2014 | Suthiwongsunthorn et al. | 257/774 |
| 2014/0118059 A1* | 5/2014 | Kim et al. | 327/535 |

* cited by examiner

CHIP WITH THROUGH SILICON VIA ELECTRODE AND METHOD OF FORMING THE SAME

BACKGROUND OF THE INVENTION

1. Field of the Invention

The present invention relates to a chip and the forming method thereof, and more particularly, to a chip with a through silicon via (TSV) electrode and the forming method thereof.

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed.

In order to evaluate the functions and efficiency of the chip and increase the capacitance density to accommodate more IC components in a limited space, many semiconductor package technologies are built up by stacking each die and/or chip, for example, Flip-Chip technology, Multi-chip Package (MCP) technology, Package on Package (PoP) technology and Package in Package (PiP) technology. Besides these technologies, a "Through Silicon Via (TSV)" technique has been well developed in recent years. TSV can improve the interconnections between chips in the package so as to increase the package efficiency.

SUMMARY OF THE INVENTION

The present invention therefore provides a chip with TSV electrode and a method of forming the same, which can save the cost of the processes.

According to one embodiment of the present invention, a method of forming a chip with TSV electrode is provided. A substrate with a first surface and a second surface is provided. A thinning process is performed from a side of the second surface so the second surface becomes a third surface. Next, a penetration via which penetrates through the first surface and the third surface is formed in the substrate. A patterned material layer is formed on the substrate, wherein the patterned material layer has an opening exposes the penetration via. A conductive layer is formed on the third surface thereby simultaneously forming a TSV electrode in the penetration via and a surface conductive layer in the opening.

According to another embodiment of the present invention, a chip with a TSV electrode is provided. The chip includes a substrate, a penetration via, a TSV electrode and a surface conductive layer. The substrate includes a first surface and a third surface. The penetration via is disposed in the substrate and penetrates through the first surface and the third surface. The TSV electrode is disposed in the penetration via. The surface conductive layer is disposed on the third surface outside the penetration via and is monolithic with the TSV electrode.

By forming the TSV electrode and the surface conductive layer simultaneously, the TSV electrode and the surface conductive layer are monolithic, thereby saving the manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
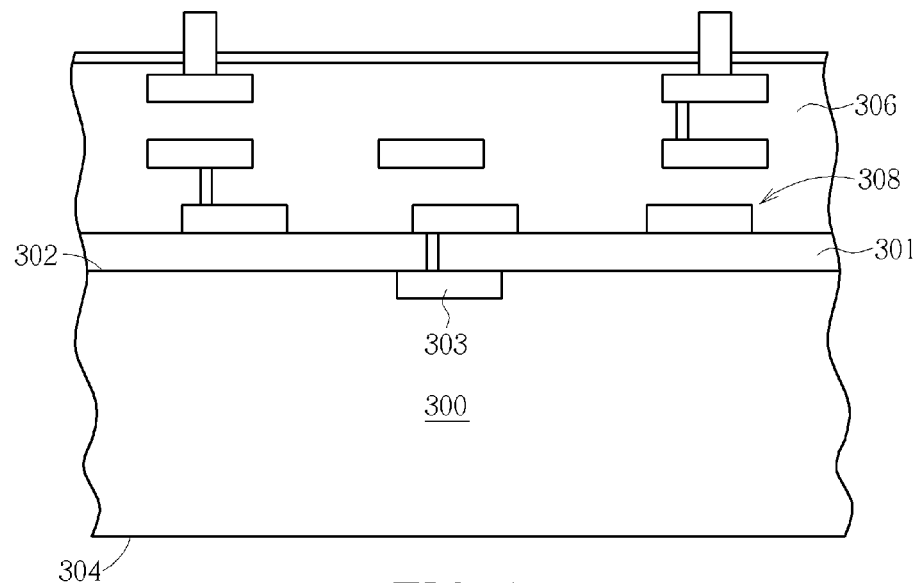
FIG. 1 to FIG. 7 show schematic diagrams of the method of forming a chip with a TSV electrode according to the first embodiment of the present invention.

Please refer to FIG. 1 to FIG. 7, which show schematic diagrams of the method of forming a chip with a TSV electrode according to the first embodiment of the present invention. As shown in FIG. 1, a substrate 300 is provided, such as a silicon substrate, an epitaxial silicon substrate, a silicon germanium substrate, a silicon carbide substrate or a silicon-on-insulator substrate (SOI), but is not limited thereto. The substrate 300 has a first surface 302 and a second surface 304, which are opposite to each other. In one preferred embodiment, the first surface 302 is the active surface of the substrate 300 and the second surface 304 is the back surface of the substrate 300. A thickness of the substrate 300 is about 700 to 1000 micro meters. Next, a semiconductor device 303 such as a metal oxide semiconductor transistor (MOS transistor) or a memory cell of a dynamic random access memory (DRAM) is formed on the first surface 302 of the substrate 300. An inter-dielectric layer (ILD) 301 such as a $SiO_2$ layer is formed on a side of the first surface 302 to cover the semiconductor device 303. A plurality of intra-metal dielectric layers (IMD layer) 306 and a metal interconnection system 308 in the IMD layers 306 are formed on the ILD layer 301. The metal interconnection system 308 may be electrically connected to the semiconductor device 303 by a contact plug so the semiconductor device 303 can receive or send out signals.

Figure 2:
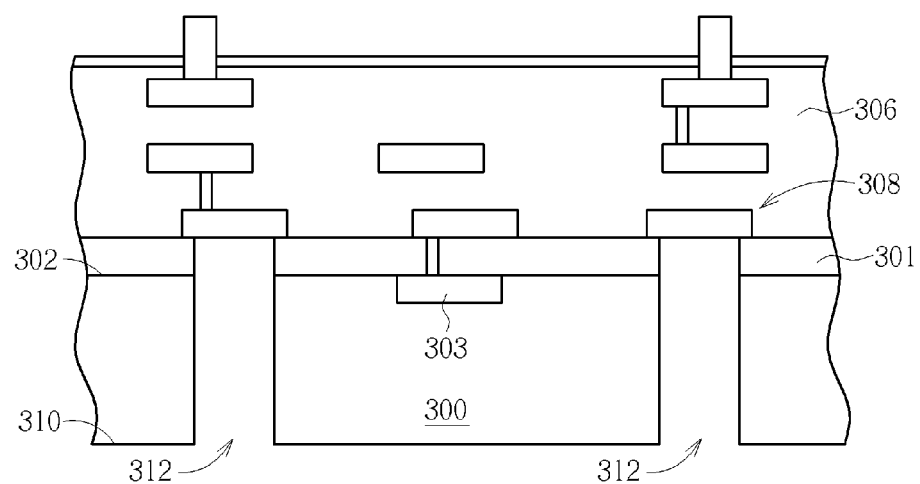

As shown in FIG. 2, after forming the metal interconnection system 308, a thinning process is carried out from the second surface 304 of the substrate 300 to thin the substrate 300 to a determined thickness, such as 10 to 100 micro meters. The second surface 304 therefore becomes a third surface 310. Next, a penetration via 312 is formed from a side of the third surface 310 of the substrate 300 wherein the penetration via 312 penetrates through the first surface 302 and the third surface 310, preferably through the ILD layer 301 so as to expose a part of the metal interconnection system 308. The process of forming the penetration via 312 can be a dry etching process. In one embodiment, an aperture of the penetration via 312 is about 5 to 100 micro meters, but is not limited thereto. It is understood that the type or the forming method of the penetration via 312 can be adjusted according to different designs of the products.

Figure 3:
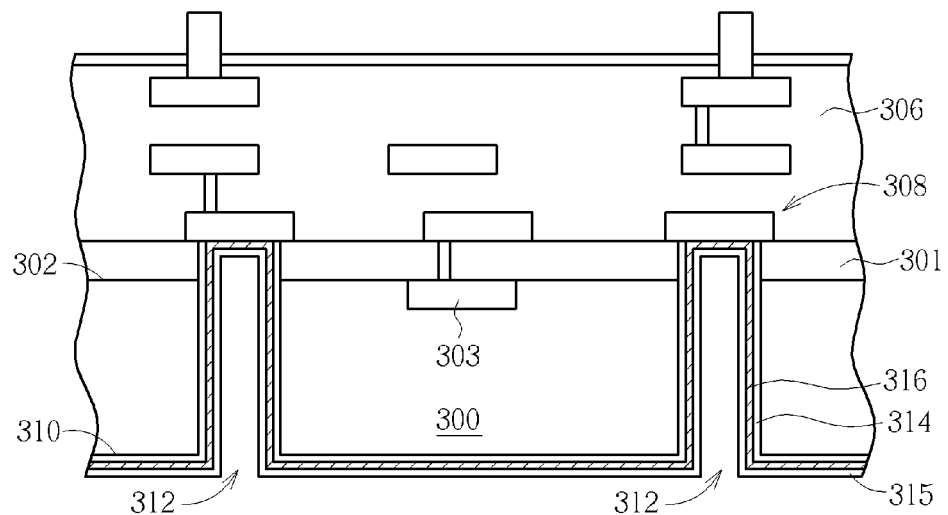

As shown in FIG. 3, a dielectric layer 314 is formed on the third surface 310 of the substrate 300 and on the surface of the penetration via 312. In one preferred embodiment of the present invention, the dielectric layer 314 covers the sidewall of the penetration via 312, but does not covers the bottom surface of the penetration via 312. In one embodiment, the dielectric layer 314 is a $SiO_2$ layer and is formed by a thermal oxidation process which only reacts with the exposed substrate 300. Preferably, the dielectric layer 314 is not formed on the surface of the metal interconnection system 308. Subsequently, an optional barrier layer 316 and an optional seed layer 315 are sequentially formed on the dielectric layer 314. The barrier layer 316 and the seed layer 315 are formed conformally along the sidewall and the bottom surface of the penetration via 312 and the third surface 310. The method of forming the barrier layer 316 and the seed layer 315 can be, for example, a chemical vapor deposition (CVD) or a physical vapor deposition (PVD). In one embodiment, the barrier layer 316 is nitride titanium (TiN), titanium (Ti), tantalum nitride (TaN), tantalum (Ta) or combinations thereof, an the seed layer 315 is a copper seed layer.

Figure 4:
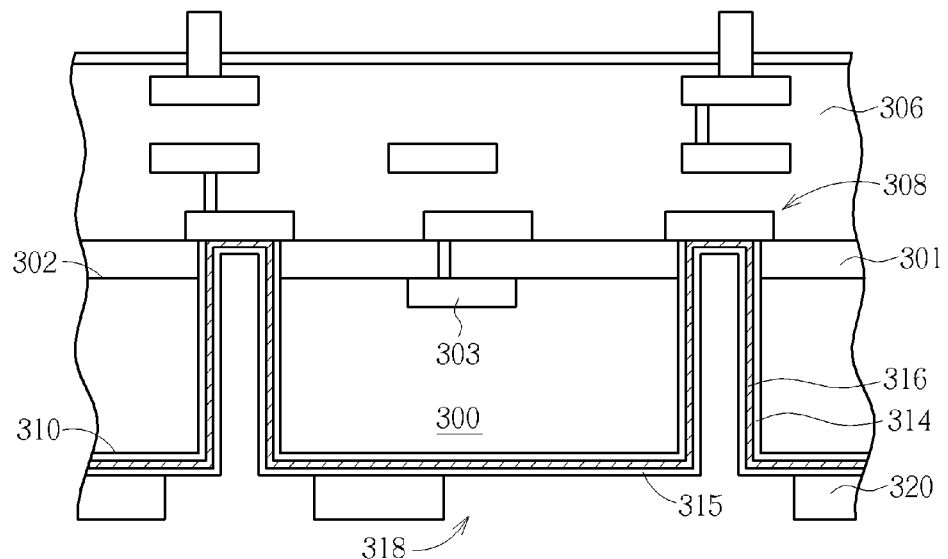

As shown in FIG. 4, a patterned material layer 320 is formed on the third surface 310 of the substrate 300 and covers the barrier layer 316 and the seed layer 315. The patterned material layer 320 has at least an opening 318 which exposes the penetration via 312. Preferably, a width of the opening 312 is greater than that of the penetration via 312 so as to define the position of the TSV electrode and the redistribution layer (RDL) in the subsequent steps. In one embodiment, the patterned material layer 320 is a photoresist layer and is formed through a lithography process. In another embodiment, the patterning material layer 320 can be a mask layer and is formed by a lithography process and an etching process.

Figure 5:
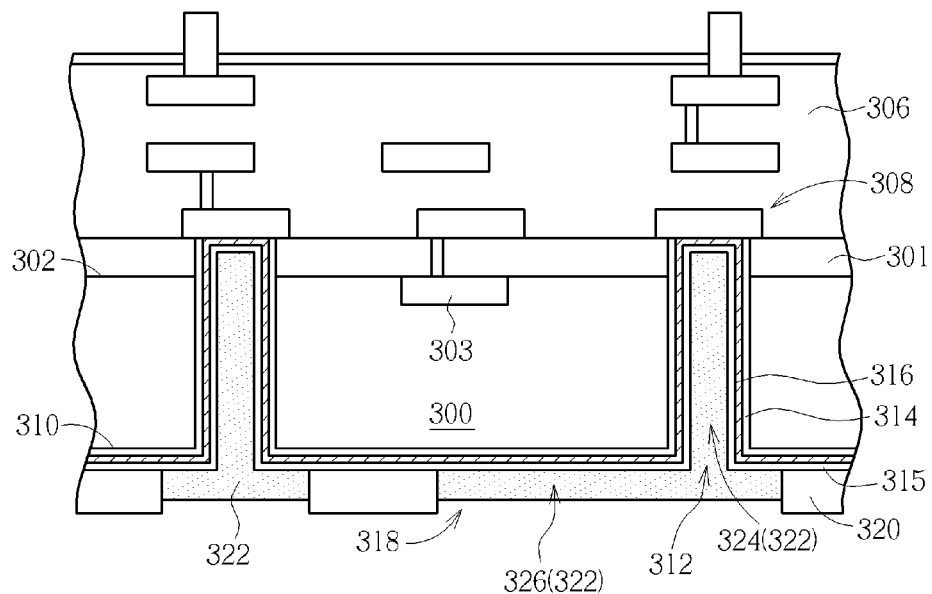

As shown in FIG. 5, a conductive layer 322 such as a copper layer is formed in the penetration via 312 in the substrate 300 and in the opening 318 in the patterning material layer 320. The conductive layer 322 can be formed by an electroplating process. Since a part of the seed layer 315 is covered by the patterned material layer 320, so the conductive layer 322 is formed only on the exposed seed layer 315. Thus, the conductive layer 322 located in the penetration via 312 becomes a TSV electrode 324 and the conductive layer 322 located in the opening 318 becomes a surface conductive layer 326. Since the TSV electrode 324 and the surface conductive layer 326 are formed simultaneously in the same step, the TSV electrode 324 and the surface conductive layer 326 are monolithic and no interface is formed therebetween. By the electroplating process, the surface conductive layer 326 has a fine flat surface, so no additional planarization process is required.

Figure 6:
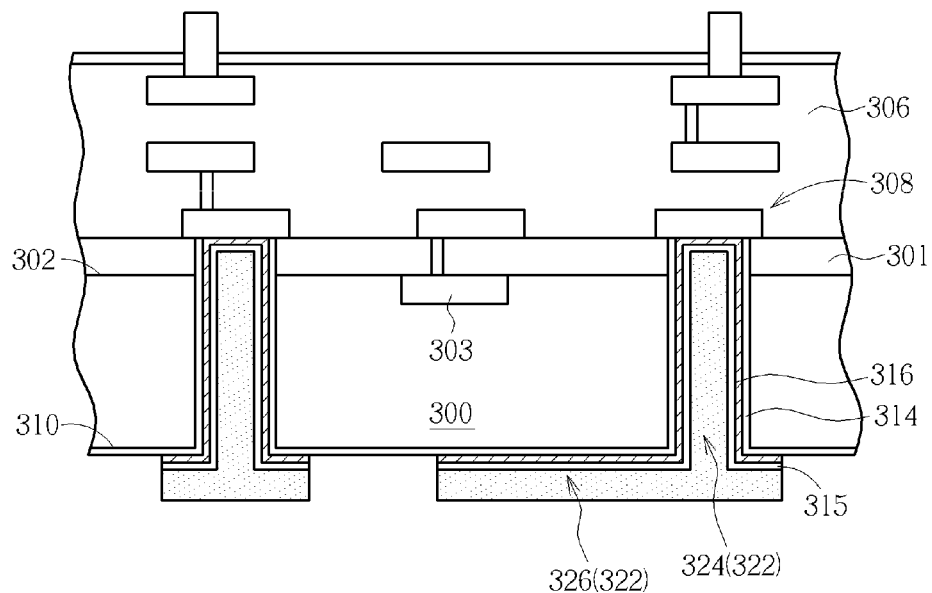

As shown in FIG. 6, the patterned material layer 320 is removed. Next, the seed layer 315 and the barrier layer 316 below the patterned material layer 320 are further removed to ensure that the TSV electrodes 324 will not short with each other. Preferably, the conductive layer 326, the seed layer 315 and the barrier layer 316 are vertically aligned. In one embodiment, the surface conductive layer 326 can be an RDL layer or a part or a whole of an integrated passive device (IPD). For example, the integrated passive device can a resistor, a capacitor, an inductor or an antenna. As shown in FIG. 6, the surface conductive layer 326 is an RDL. In the subsequent step, an electrical connection element such as a solder bump can be formed on the surface conductive layer 326 to provide an electrical pathway to another chip or a printed circuit board (PCB).

Figure 7:
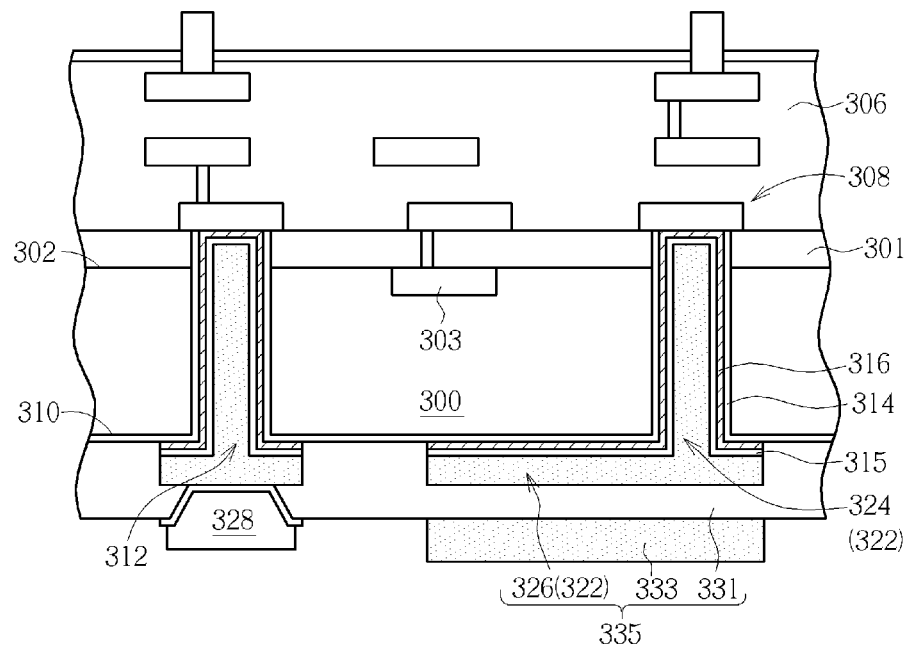

Alternatively, as shown in FIG. 7, the IPD can be of different types. For example, one or a plurality of dielectric layers 331 can be formed on the surface conductive layer 326, following by forming a metal layer 333 on the dielectric layer 331. In the right side of FIG. 7, the metal layer 333, the dielectric layer 331 and the conductive layer 326 constitute a capacitor structure. In the left side of FIG. 7, a bump 328 can be formed to contact the surface metal layer 326 to provide an electrical pathway to another chip or a PCB.

As shown in FIG. 7, the present invention provides a chip with a TSV electrode. The chip includes a substrate 300, a penetration via 312, a TSV electrode 324 and an IPD 335. The substrate 300 has a first surface 302 and a third surface 310. The penetration via 312 is disposed in the substrate 300 and penetrates through the first surface 302 and the third surface 310. The TSV electrode 324 is disposed in the penetration via 312. The IPD 335 is disposed on a side of the third surface 310 of the substrate 300. The IPD 335 includes a surface conductive layer 326, which is located on the third surface 310 outside the penetration via 312 and is monolithic with the TSV electrode 324. In one embodiment, the chip further includes a barrier layer 316 or a seed layer 315 which is disposed between the surface conductive layer 326, the TSV electrode 324 and the substrate 300. In one preferred embodiment, the barrier layer 316, the seed layer 315 and the surface conductive layer 326 are vertically aligned along third surface 310. It is noted that, in another embodiment, the barrier layer 316 and/or the seed layer 315 may be omitted depending on the design of the product.

Figure 8:
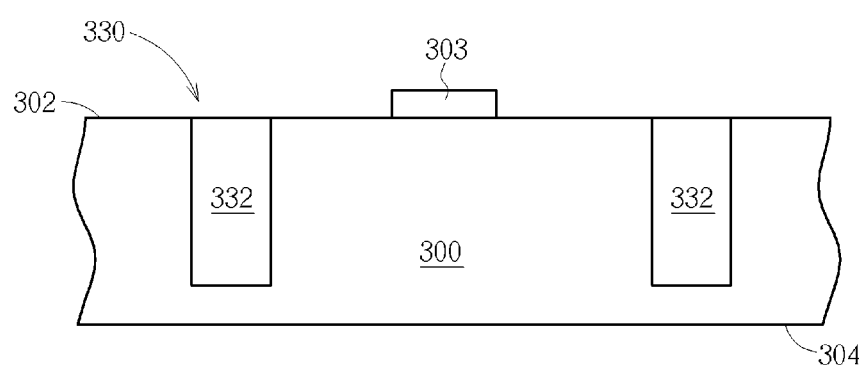
FIG. 8 to FIG. 10 show schematic diagrams of the method of forming a chip with a TSV electrode according to the second embodiment of the present invention.
Figure 9:
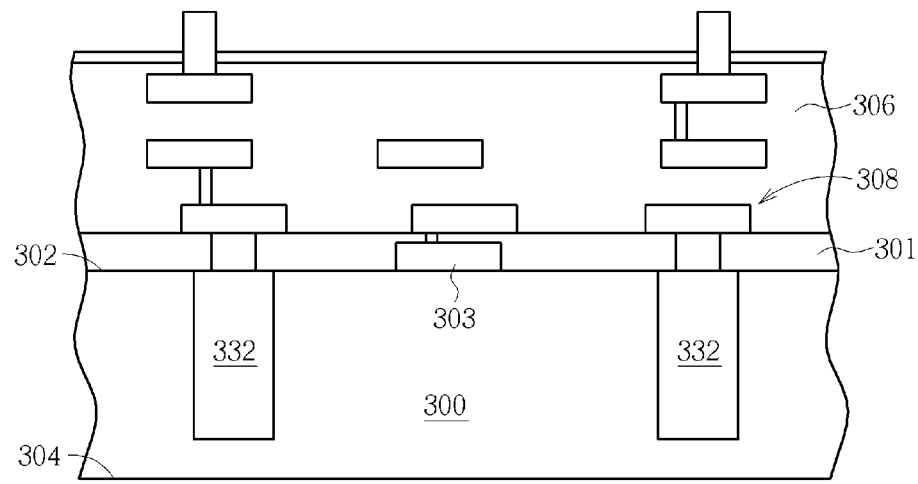
Figure 10:
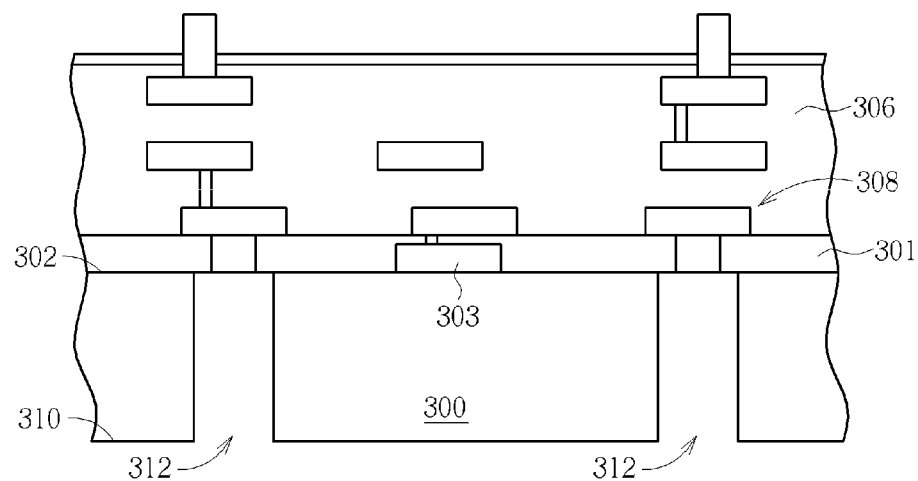

Please refer to FIG. 8 to FIG. 10, which show schematic diagrams of the method of forming a chip with a TSV electrode according to the second embodiment of the present invention., For the same or similar components, the second embodiment uses the same reference numerals as in the first embodiment to provide clear description. As shown in FIG. 8, a substrate 300 is provided, such as a silicon substrate, an epitaxial silicon substrate, a silicon germanium substrate, a silicon carbide substrate or a silicon-on-insulator substrate (SOI), but is not limited thereto. The substrate 300 has a first surface 302 and a second surface 304, which are opposite to each other. The first surface 302 is the active surface of the substrate 300 and the second surface 304 is the back surface of the substrate 300 for example. A thickness of the substrate 300 is about 700 to 1000 micro meters. Next, a via 330 is formed on the first surface 302 of the substrate 300. An aperture of the via 330 is about 5 to 10 micro meters and a depth of the via 330 is about 50 to 100 micro meters, but is not limited thereto. Subsequently, a sacrificial layer 332 is formed on the substrate 300 to fill into the via 330. The step of forming the sacrificial layer 332 can include a deposition process and a planarization process such as a chemical mechanical polish (CMP) process. In one embodiment, the sacrificial layer 332 can include dielectric material, spin-on glass (SOG), or photoresist. Preferably, the sacrificial layer 332 is SOG which can provide good filling capability. Next, a semiconductor device 303 such as a MOS transistor or a DRAM memory cell is formed on the first surface 302 of the substrate 300.

As shown in FIG. 9, an ILD 301 such as a $SiO_2$ layer is formed on a side of the first surface 302 to cover the semiconductor device 303. A plurality of IMD layers 306 and a metal interconnection system 308 in the IMD layers 306 are formed over the ILD layer 301. The metal interconnection system 308 may be electrically connected to the semiconductor device 303 by a contact plug.

As shown in FIG. 10, after forming the metal interconnection system 308, a thinning process is performed from a second surface 304 of the substrate 300 to expose the sacrificial layer 332. The sacrificial layer 332 is then removed. The second surface 304 becomes a third surface 310, and the via 330 becomes a penetration via 312 which penetrates through the first surface 302 and the third surface 310. The following steps can be proceeded in accordance with the first embodiment in FIG. 3, and are not described repeatedly. However, it is noted that the penetration via 312 in the second embodiment has a different length with respect to the first embodiment. That is, the penetration via 312 in the first embodiment penetrates further to the ILD layer 301 while the penetration via 312 in the second embodiment only penetrates the substrate 300.

In summary, the present invention provides a chip with a TSV electrode and a method of forming the same. By forming the TSV electrode and the surface conductive layer simultaneously, the TSV electrode and the surface conductive layer are monolithic. Thus, the manufacturing cost can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip with a through-silicon-via (TSV) electrode, comprising:
   a substrate, which has an active surface and a back surface;
   a penetration via disposed in the substrate, wherein the penetration via penetrates through the active surface and the back surface;
   a TSV electrode disposed in the penetration via;
   a surface conductive layer disposed on the back surface outside the penetration via and directly contacting the back surface, wherein the surface conductive layer is a redistribution layer, and the surface conductive layer and the TSV electrode are monolithic; and
   an integrated passive device (IPD) disposed on the back surface, the IPD comprising the surface conductive layer.

2. The chip with a TSV electrode according to claim 1, wherein the IPD comprises a bumper, a resistor, a capacitor, an inductor or an antenna.

3. The chip with a TSV electrode according to claim 1, further comprising a barrier layer disposed between the substrate and the surface conductive layer, wherein the barrier layer and the surface conductive layer are vertically aligned.

4. The chip with a TSV electrode according to claim 1, further comprising a seed layer disposed between the substrate and the surface conductive layer, wherein the seed layer and the surface conductive layer are vertically aligned.

5. The chip with a TSV electrode according to claim 1, further comprising a dielectric layer disposed between the substrate and the surface conductive layer.

6. The chip with a TSV electrode according to claim 1, further comprising a metal interconnection system disposed on the active surface of the substrate.

7. The chip with a TSV electrode according to claim 1, further comprising an inter-dielectric layer (ILD), disposed on the active surface of the substrate, and the penetration via penetrates through the inter-dielectric layer.

8. A chip with a TSV electrode, comprising:
   a substrate, which has an active surface and a back surface;
   a penetration via disposed in the substrate, wherein the penetration via penetrates through the active surface and the back surface;
   a TSV electrode disposed in the penetration via; and
   an integrated passive device (IPD) disposed on the back surface, the IPD comprising a surface conductive layer, wherein the surface conductive layer is a redistribution layer disposed on the back surface outside the penetration via, and the surface conductive layer and the TSV electrode are monolithic.

* * * * *